United States Patent [19]

Cassat et al.

[11] 4,456,657

[45] Jun. 26, 1984

[54] METAL-CLAD LAMINATE ADAPTED FOR PRINTED CIRCUITS

[75] Inventors: Robert Cassat, Ternay; Bruno Vignando, Saint-Fons, both of France

[73] Assignee: Rhone-Poulenc Industries, Paris, France

[21] Appl. No.: 314,014

[22] Filed: Oct. 22, 1981

[30] Foreign Application Priority Data

Nov. 5, 1980 [FR] France .................................. 80 23943

[51] Int. Cl.$^3$ ........................ B32B 15/06; B32B 17/10; B32B 19/04
[52] U.S. Cl. .................................... 428/415; 428/416; 428/428; 428/433; 428/435; 428/438; 428/444; 428/445; 428/454; 428/457; 428/458; 428/473.5; 428/507; 428/526; 428/533
[58] Field of Search ............ 428/457, 901, 458, 473.5, 428/415, 416, 444, 445, 428, 438, 433, 435, 454, 533, 507, 526; 156/307.5

[56] References Cited

U.S. PATENT DOCUMENTS 4,110,147 8/1978 Grunwald et al. ............... 156/307.5
4,317,856 3/1982 Huthwelker et al. .......... 428/457 X

*Primary Examiner*—Thomas J. Herbert, Jr.
*Attorney, Agent, or Firm*—Burns, Doane, Swecker & Mathis

[57] ABSTRACT

A metallized, laminated substrate well adapted for the production of printed circuits is comprised of:

(A) an electrically insulating support element which comprises (a) a central core member comprising a major proportion by weight of a cellulosic or mica filler and a minor proportion by weight of a thermosetting resin, and (b) and (b') a pair of skin laminae coextensively secured to each face surface, respectively, of said central core (a) each of said skin laminae comprising a fibrous glass, asbestos or heat-stable synthetic polymer reinforcing filler, and a thermosetting resin impregnant, which thermosetting resin may either be the same as or different from the thermosetting resin comprising said central core member (a); and (B) an electrically conducting metal foil (c) coextensively adhered to the exposed face surface of one or the other of said skin laminae (b) or (b').

14 Claims, No Drawings

METAL-CLAD LAMINATE ADAPTED FOR PRINTED CIRCUITS

BACKGROUND OF THE INVENTION

1. Field of the Invention

The present invention relates to substrates comprised of a reinforced polymeric material overcoated with metal, and, more especially, to such substrates adapted for producing printed circuits. The topic metallized substrates are typically generically designated as "metal-clad".

2. Description of the Prior Art

Such metallized substrates are well known to those skilled in this art (compare U.S. Pat. No. 4,110,147). They generally comprise an electrically insulating support material and a conducting metal foil adhering to one or both of its face surfaces. This metal foil can be, in particular, a copper, aluminum, nickel or stainless steel foil having a thickness of between 10 and 100$\mu$, depending upon the type of printed circuit desired to be produced.

The metallized substrates in question can be rigid, semi-rigid or flexible, depending upon the composition of the insulating support material. The expression "semi-rigid substrate" designates a material which can withstand elastic deformation, by bending, down to a very small radius of curvature.

In the case of the rigid or semi-rigid metallized substrates, to which the present invention relates more particularly, the insulating support material is typically formed by stacking together a certain number of prepregs which each result from the association, known per se, of a reinforcing filler of elongate structure with a polymeric material. In the case of a common reinforcing filler, such as, for example, a glass fabric weighing 200 g/m$^2$, an average of about 12 prepregs are used. The usual prepregs are comprised of cellulose papers, cotton fabrics or glass fabrics impregnated with synthetic polymers. Phenol/formaldehyde resins, polyester resins and especially polyepoxy resins are the products most frequently employed. The reinforcing filler, namely, paper or glass fabric, is generally impregnated with a solution of polymer in an appropriate solvent, and this enables the polymeric binder to penetrate thoroughly between the fibers of the filler. The impregnated structure is then passed through an oven heated to a temperature which enables the solvent to evaporate therefrom.

The manufacture of the metallized substrates consists of placing the stack of prepregs, covered with a metal foil on one or both of its face surfaces, depending upon whether it is desired to obtain a monometallized or bimetallized substrate, between the platens of a press. The stack is then compressed at a temperature which permits the association or consolidation of the various constituents. In certain cases, it is necessary to use an adhesive in order for the metal foils to adhere permanently to the prepregs.

SUMMARY OF THE INVENTION

In view of the fact that the demand for metallized substrates for printed circuits is ever increasing, it is a major object of the present invention to provide for the increased manufacturing output thereof, by reducing the number of individual elements, in particular the number of prepregs, from which same are fabricated. This simplification at the manufacturing level consistent with this invention is also accomplished without detracting from the mechanical and electrical properties of the resultant substrates under the influence of heat.

Another object according to the present invention is to provide metallized substrates, the manufacture of which does not give rise to environmental pollution. As indicated hereinabove, the preparation of the insulating support material typically entails a process in which a series of reinforcing structures are impregnated with a solution of polymer in an appropriate solvent. In order to obtain a prepreg which can be used for the remainder of the operations, the solvent must be removed by drying. This solvent removal, despite all precautions which may be taken to recover same, is frequently a cause or source of pollution. Other additional disadvantages related to the use of solvent are, on the one hand, its purchase price, and, on the other hand, the large amount of energy required for drying. The reduction in the number of prepregs as above outlined for purposes of simplifying the manufacture of the subject metallized substrates, therefore, is one means to solve this pollution problem. Another object of the present invention is to solve this problem completely, by dispensing with the collodion method for preparing the remaining prepregs.

Yet another object of the invention is to provide metallized substrates for printed circuits, which can easily be pierced by simple punching, and the internal composition of which enables, by applying this simplified piercing technique, obtaining smooth-walled holes for the passage therethrough of the electrical connections between the two face surfaces.

Other objects and advantages of the present invention will become more apparent from the description which follows.

Briefly, it has now been found that the above and other objects of the invention are attained by providing a metallized substrate characterized in that it comprises:

(A) an electrically insulating support material comprising three layers, namely:
  (i) a central core (a) formed by the consolidation of:
    (1) a major proportion by weight of a filler fabricated from either a cellulosic material or from mica shavings, flakes or splits, with
    (2) a minor proportion of a resin prepared from a thermosetting polymeric material, and
  (ii) two skins (b) and (b') disposed on either side of the central core (a) and formed by the consolidation of:
    (3) a reinforcing filler fabricated from either a woven fabric or a non-woven fabric (in particular, mats and felts) of glass fibers, asbestos fibers or heat-stable synthetic polymer fibers, such as, for example, polyamide-imide fibers or aromatic polyamide fibers, with
    (4) a resin fabricated from a thermosetting polymeric material, which is identical to or different from the resin (2) comprising said central core (a); and
(B) an electrically conducting metal foil (c) located against the exposed face surface of one or the other of the skins (b) and (b') (the other face surface of the said skin being in contact with said central core).

By the expression "cellulosic material" there is intended paper in the form of a pulp or strip, or woven fabrics, knitted fabrics or layers of fibers shaped from natural cellulose or chemically modified cellulose.

DETAILED DESCRIPTION OF THE INVENTION

More particularly according to this invention, the mica flakes or splits utilized are products which are usually commercially available. These splits can be employed in the crude form, but in certain cases, in order to improve the bond between the mica and the resin, it is advantageous to subject them to appropriate surface treatment, per se known to the art.

According to one preferred embodiment of the invention, the metallized substrates as described above also possess a second metal foil (c') disposed against the free face surface, which has not yet been metallized, of the second skin (b') or (b).

The various layers (a) (b) (b') (c) or (a) (b) (b') (c) (c') are permanently bonded to one another either by chemical bonding or adhesive bonding.

The central core (a) has a weight which advantageously constitutes 50 to 95% of the weight of the metallized substrate. Its essential function is to serve as a filler for the metallized substrate, such as to provide same with the required thickness, which is generally between 1 and 3 mm. The substrates most frequently employed have a thickness of 1.5 to 1.6 mm.

The essential functions of the two skins (b) and (b') are, on the one hand, to ensure the rigidity of the metallized substrate, and, on the other hand, to define an adhesive layer for the metal foils (c) and (c'). The total thickness of the two skins (b) and (b') in the metallized substrate ranges from about 0.01 to 0.3 mm.

In the central core (a), the proportion by weight of cellulosic material or of mica splits, relative to the filler + resin together, typically ranges from 60% to 95% and preferably from 65 to 90%.

The resin, which is a constituent of the central core (a) and also of the skins (b) and (b'), is comprised of a thermosetting polymeric material. Suitable resins which are exemplary are: phenolic resins, such as, for example, condensation products of phenol, resorcinol, cresol or xylenol with formaldehyde or furfural; unsaturated polyester resins, prepared, for example, by reacting an unsaturated dicarboxylic acid anhydride with a polyalkylene glycol; epoxy resins, such as, for example, the reaction products of epichlorhydrin with bisphenol A; and polyimide resins, such as, for example, those obtained by reacting an unsaturated dicarboxylic acid N,N'-bis-imide with a primary polyamine and, if appropriate, with a suitable adjuvant.

As indicated above, the resin forming part of the central core (a) can be identical to or different from that which comprises the skins (b) and (b').

The resin can be in the form of a thermosetting prepolymer (which has a softening point and is still soluble in certain solvents) for an intermediate stage of production of the metallized substrate, or in the completely cross-linked form (which is infusible and totally insoluble) in the finished component, as it is normally used.

Preferably, the resin comprising the central core (a) is of the same type as that which comprises the skins (b) and (b'), and it consists of a polyimide resin obtained by reacting an unsaturated dicarboxylic acid N,N'-bis-imide with a primary polyamine in accordance with the details set forth in U.S. Pat. Nos. 3,562,223 and 3,658,764 and in U.S. Pat. No. Re. 29,316, the disclosures of which are hereby expressly incorporated by reference. The polyimide resin can also be obtained by reacting the bis-imide with the polyamine and with various adjuvants, such as, for example, mono-imides (according to U.S. Pat. No. 3,717,615), monomers, other than imides, containing one or more polymerizable groups of the type $CH_2=C<$ (according to U.S. Pat. No. 4,035,345), unsaturated polyesters (according to U.S. Pat. No. 3,712,933) or hydroxylated organosilicon compounds (according to U.S. Pat. No. 4,238,591), the disclosures of which also being expressly incorporated by reference. In the case where such adjuvants indeed are used, it should be appreciated that the polyimide resin can be obtained either by directly heating the three reactants (bis-imide, polyamine and adjuvant) together, or by heating the reaction product, or a mixture, of the adjuvant and a prepolymer, prepared beforehand, of bis-imide and polyamine.

In the following text, the expression "thermosetting prepolymer", when it refers to the preferred polyimides, is to be understood as connoting a polymeric material which has a softening point and is still soluble in certain solvents and which can be: either the reaction product of a bis-imide and a polyamine; or the reaction product of a bis-imide, a polyamine and an adjuvant; or the reaction product of a prepolymer of bis-imide and polyamine, and an adjuvant; or also a mixture of a prepolymer of bis-imide and polyamine, and an adjuvant.

Even more preferably, the polyimide resin used in the present invention is prepared by reacting a bis-maleimide, such as N,N'-4,4'-diphenylmethane-bis-maleimide, with a primary diamine, such as 4,4'-diaminodiphenylmethane, and, if appropriate, with one of the various adjuvants mentioned above.

It should be appreciated that the polyimide resin comprising the central core (a) can, if appropriate, have a chemical composition which is identical to or different from that of the polyimide resin comprising the skins (b) and (b'). Thus, if the central core (a) includes a filler of a cellulosic material, it is very especially preferred that the polyimide resin comprising the said central core preferably be a polyimide resin originating from the reaction of the bis-imide with the polyamine and with one of the above-mentioned adjuvants, in particular a hydroxylated organosilicon compound. As regards the polyimide resin comprising the skins (b) and (b'), it can then have the same chemical composition or can simply result from the reaction of the bis-imide with the polyamine.

Examples of suitable hydroxylated organosilicon compounds are $\alpha,\omega$-dihydroxy-methylphenylpolysiloxane oils having from 4 to 9% by weight of hydroxyl groups.

As regards the skins (b) and (b'), the proportion by weight of reinforcing filler, relative to the reinforcing filler + resin together, typically ranges from 20% to 90% and preferably ranges from 40 to 70%.

The metal foil or foils employed have all of the characteristics known to those skilled in the art and referred to above. It is preferred to use copper foils having a thickness ranging from 15 to 70$\mu$. The most common thickness is 35$\mu$.

The present invention also relates to a technique for the manufacture of metallized substrates of the above type.

This technique essentially comprises successively stacking together:

(i) a metal foil;
(ii) a first prepreg comprising a woven fabric or a non-woven fabric of glass fibers, asbestos fibers or heat-stable synthetic polymer fibers, impregnated with a thermosetting prepolymer;

(iii) a felt or a composite comprising a cellulosic material or mica splits and a thermosetting prepolymer; and (iv) a second prepreg as defined under (ii), and then in compressing the stack at a temperature which permits the consolidation of the various elements. This provides a substrate metallized on only one face surface.

According to another embodiment of the invention, a second metal foil (v) can be added to the layer (iv) of the stack, such as to provide a substrate metallized on both face surfaces.

As indicated above, the skins (b) and (b') are formed by the association of a reinforcing filler with a resin. More precisely, this association is an impregnation. The impregnation of the filler can be carried out, in a conventional manner, by a collodion method, namely, by means of a solution of a thermosetting prepolymer in a suitable solvent, for example, a polar solvent such as dimethylformamide, N-methylpyrrolidone, dimethylacetamide, diethylformamide or N-acetylpyrrolidone. However, in order to dispense with the use of solvent and to completely solve the pollution problem referred to above, it is possible to impregnate the filler under dry conditions by dusting it with the thermosetting prepolymer or by means of an aqueous dispersion of prepolymer; if a polyimide prepolymer is involved, the various techniques described in U.S. Pat. No. 4,038,450 and in British Pat. No. 1,400,512 can be followed. These processes lead to the preparation of the prepregs (ii) and (iv) formed by a reinforcing filler and a prepolymer. During the subsequent treatments (compression and heating of the stack referred to above), these prepregs are converted to the skins (b) and (b') by cross-linking of the prepolymer.

The material which is converted, during the said subsequent treatments, to a central core (a) (or precursor material of the central core) is a felt or a composite comprised of a cellulosic material or mica and a thermosetting prepolymer. The felt is produced by a papermaking method and the composite is produced by a dry method.

According to the papermaking method, all of the ingredients, namely, at one and the same time the water, the filler (cellulosic material or mica) and the binder (thermosetting prepolymer) in powder form, are incorporated directly into a mixer referred to in the papermaking industry as a "beater". The felt is then formed on a paper machine from the pulp obtained, and the water is extracted from the felt, on the one hand by draining and applying a vacuum, and on the other hand by drying at a temperature on the order of 70° to 110° C., generally by passing the felt through a ventilated oven. In this felt, the binder is still at the prepolymer stage. The felt prepared in this way has a density of between 0.3 and 2, whereas, at the final stage, namely, after compression of the felt and curing of the prepolymer, the density of the central core ranges from about 1.5 to 2.7.

It will be appreciated that the proportions by weight of the filler (for the felt or the composite), of the reinforcing filler (for the prepregs) and of the thermosetting prepolymer which are used for the fabrication of the constituents (ii), (iii) and (iv) correspond to those indicated hereinabove concerning the definition of the central core (a) and the skins (b) and (b'). It will also be appreciated that the constituent (iii) which is the precursor of the central core (a) must have a weight which generally represents 50 to 95% of the weight of the final metallized substrate.

According to the dry method, the filler and the thermosetting prepolymer are simply mixed under dry conditions to provide a pulverulent composite. The composite thus obtained is either directly molded with the prepregs (ii) and (iv) and one or both of the metal foils (i) and (v), or, preferably, is subjected beforehand to a preliminary sintering operation in order to make it easier to handle for the purpose of preparing the metallized substrate.

According to the dry method, if the filler is mica, it is very especially preferred to use mica splits which have been subjected to a surface treatment beforehand. This treatment consists, in particular, in coating the mica splits with an alkoxysilane containing one or more ethylenically unsaturated groups, the amount of treating agent generally representing 0.1 to 3% of the weight of the micaceous filler. Examples of suitable alkoxysilanes are vinyltriethoxysilane, methylvinyldiethoxysilane and vinyl-tris-(methoxyethoxy)-silane.

To produce the metallized substrates according to the invention, the constituents (i), (ii), (iii), (iv) and, if appropriate (v), defined above, are placed on a platen of a press. The assembly is then strongly compressed. More precisely, the assembly is compressed, typically between 10 and 300 bars, at a temperature which enables the prepolymer present in the various constituents to soften.

In the case of the preferred polyimide prepolymers obtained from a bis-imide, a polyamine and, if appropriate, one of the above-mentioned adjuvants (generally having a softening point between 50° and 200° C.), the compression temperature is advantageously between 70° and 280° C. Preferably, in order to permit effective bonding (or joining) of the various constituents, the temperature is above 150° C.

These compression temperature conditions also apply to the other type of thermosetting prepolymers falling within the scope of the present invention. In general, heating the prepolymers makes it possible to successively soften and then cure them. It is of course possible to bake the assembly, for example, for a few hours at 200° C. or above.

The aforesaid technique for the manufacture of the metallized substrates according to the invention has numerous advantages.

As has already been mentioned, this manufacture is simplified by virtue of using a restricted number of constituents, and it makes it possible to wholly or partially dispense with processes for impregnating a reinforcing structure by a collodion method, which processes cause pollution.

However, there are other advantages. The preparation of the precursor of the central core (a) by a papermaking method (felt) is a high-efficiency process. Furthermore, the papermaking method makes it possible to recycle the waste; there is no disadvantage in re-introducing, into the beater, the felt waste formed before drying. Likewise, the dry method (composite), which proceeds via a sintered preform, also eliminates the existence of waste. Furthermore, it is noted that there is virtually no flow of polyimide during the final hot compression. In brief, this possibility of recycling, together with virtually zero flow during compression, ensures a very small loss of resin during manufacture.

The quality of the characteristics of the metallized substrates according to the present invention (in particular: mechanical characteristics; peel strength of the metal foils; heat resistance; water resistance; and electrical characteristics) is totally satisfactory and compatible for use in the electronics industry.

In order to further illustrate the present invention and the advantages thereof, the following specific examples are given, it being understood that same are intended only as illustrative and in nowise limitative.

EXAMPLE 1

In this example, a detailed description is given of the technique for the manufacture of a bicoppered substrate (also referred to as a copper-clad) comprising a central core made from a paper felt, sandwiched between two skins made from an impregnated glass fabric.

(1) Production of the paper felt:

The following ingredients were charged into the mixer (referred to as the beater) of a paper machine:

(i) an unbleached kraft-type paper pulp consisting of 276 g of cellulosic material dispersed in 8 liters of water;

(ii) 83 g of a powder of a prepolymer prepared from N,N'-4,4'-diphenylmethane-bis-maleimide and 4,4'-diaminodiphenylmethane (molar ratio bis-imide/diamine=2.5) and having a softening point of 70° C.;

(iii) 35.5 g of $\alpha,\omega$-dihydroxy-methylphenylpolysiloxane oil containing 7% by weight of hydroxyl groups; and (iv) 15.1 g of an aqueous solution containing: 1.5 g of polyvinyl alcohol (Rhodoviol 20/140 from RHONE-POULENC), 1.8 g of propylene glycol and 0.09 g of sorbic acid.

Polyvinyl alcohol, propylene glycol and sorbic acid are well-known ingredients in the various processes for the preparation of papers.

The entire mass was homogenized by agitation for about 1 hour. In order to facilitate malaxation, the pulp was diluted by adding a small amount of water (about 3 liters).

After malaxation, the pulp was introduced in portions of about 2,800 g into a paper machine of the following type: a "Franckformer" equipped with a square-shaped grid having a side length of 300 mm, with a square mesh having a side length of 120$\mu$. The water was removed each time by natural draining and by applying a vacuum (pressure reduced to 50 mm of mercury). The various felts obtained were dried at 90°-100° C. for two hours in a ventilated oven. These felts had dimensions of about 300×300×10 mm and each weighed between 110 g and 140 g. Same comprised about 70% by weight of cellulosic fibers and 30% by weight of polyimide prepolymer (bis-imide/diamine prepolymer + organosilicon compound). The other components, namely, polyvinyl alcohol, propylene glycol and sorbic acid, being soluble in water, were totally eliminated in the aqueous phase, which was recycled.

(2) Production of the impregnated glass fabric:

A collodion was prepared which comprised 50% by weight of N-methylpyrrolidone and 50% by weight of a polyimide prepolymer prepared from N,N'-4,4'-diphenylmethane-bis-maleimide and 4,4'-diaminodiphenylmethane (molar ratio bis-imide/diamine=2.5) and which had a softening point of 100° C.

This collodion was deposited with a paint brush on both face surfaces of a glass fabric of the Tissaverre 278 type (cloth weighing 200 g/m$^2$), so as to have a weight ratio glass fabric/polyimide prepolymer of 65/35. The collodion was deposited in two stages separated by drying for 1 minute at 140° C. After the second application, drying was carried out for 10 minutes at 140° C. in a ventilated oven. Two pieces having the following dimensions: 300×300×0.25 mm, and each weighing 27.5 to 28 g, were cut out of the web of prepreg; these were intended to form the two supports enclosing the paper felt.

(3) Production of the copper-clad:

The following lamina were successively stacked on the platen of a press:

(i) a first 35$\mu$ thick copper foil of the TC Foil type, having a square shape with a side length of 300 mm;

(ii) one of the prepregs;

(iii) a felt weighing 124 g;

(iv) the second prepreg; and (v) a second 35$\mu$ copper foil, and the assembly was then compressed:

for 15 minutes at 160° C. under 25 bars (with degassing in the 3rd and 5th minute), and then for 2 hours at 180° C. under 25 bars (the temperature of 180° C. being set after the 15 minutes without interrupting the cycle).

There was no flow of pure resin.

This provided a 300×300×1.6 mm copper-clad weighing 237 g. In this article, the weight of the central core was about 52% of the total weight of the copper-clad.

The mechanical flexural strength properties of the copper-clad were as follows (measurements according to ASTM Standard Specification D 790):

(a) flexural strength at about 20° C.: 34.5 kg/mm$^2$, (b) flexural modulus at about 20° C.: 1,900 kg/mm$^2$.

(c) The peel strengths of the copper were as follows: (the peeling was carried out, perpendicular to the bonding plane, on a 1 cm wide strip of copper-clad):

| | Time 0 | After 250 hours at 150° C. | After 500 hours at 150° C. | After 1,000 hours at 150° C. |
|---|---|---|---|---|
| Averages in kg/cm | 1.77 | 1.85 | 1.87 | 1.92 |

The peel strengths were very homogeneous and the heat aging was overall favorable.

EXAMPLE 2

In this example, a detailed description is given of the technique for the manufacture of a copper-clad comprising a central core made from a mica felt, sandwiched between two skins made from an impregnated glass fabric.

(1) Production of the mica felt:

The following ingredients were charged into the mixer (referred to as the "beater") of a paper machine:

(i) 63.8 g of mica splits of the Suzorite 60 S type;

(ii) 11.2 g of polyimide prepolymer prepared from N,N'-4,4'-diphenylmethane-bis-maleimide and 4,4'-diaminodiphenylmethane (molar ratio bis-imide/diamine=2.5) and having a softening point of 70°; and (iii) 0.5 liter of water.

The entire mass was homogenized by agitation for 10 minutes and then introduced into the Franck paper machine, this time equipped with a disc-shaped grid having a diameter of 200 mm, with a square mesh having a side length of 120μ. The circular felt obtained was dried at 100° C. for 2 hours in a ventilated oven. It had a thickness of about 2.5 mm and weighed 71 g. It comprised about 85% by weight of mica and 15% by weight of polyimide prepolymer. For the remainder of the operations, a square (inscribed) of felt having a side length of 140 mm and weighing 45 g was cut out of this circular felt of diameter 200 mm.

(2) Production of the impregnated glass fabric:

Reference should be made to Example 1, part (2). It should be noted that two square prepregs having a side length of 140 mm were cut out of the web obtained.

(3) Production of the copper-clad:

The procedure indicated above in Example 1 was followed, but two 35μ thick, square copper foils having a side lengths of 140 mm were used.

The compression conditions were as follows:

15 minutes at 160° C. under 40 bars (with degassing in the 3rd and 5th minute);

and then 1 hour at 180° C. under 40 bars (the temperature of 180° C. being set after the 15 minutes without interrupting the cycle).

There was no flow of pure resin.

The shaped article obtained was then baked for 24 hours at 200° C.

The characteristics of the copper-clad were as follows:

dimensions: 140×140×1.6 mm; weight: 69.8 g; the weight of the central core corresponding to about 64% of the total weight of the copper-clad.

| flexural strength: | |
|---|---|
| at about 20° C.: | 20.7 kg/mm$^2$ |
| at 180° C.: | 18.4 kg/mm$^2$ |
| flexural modulus: | |
| at about 20° C.: | 3,250 kg/mm$^2$ |
| at 180° C.: | 2,755 kg/mm$^2$ |
| peel strength (time 0): | 1.6 kg/cm (average value) |
| coefficient of expansion: | 10 × 10$^{-6}$ cm/cm/°C. |

EXAMPLE 3

In this example, a detailed description is given of the technique for the manufacture of a copper-clad comprising a central core made from a sintered mica composite, sandwiched between two skins made from an impregnated glass fabric.

(1) Production of the sintered composite:

The following ingredients were dry-mixed in an industrial CNTA-type mixer:

(i) 85 parts by weight of mica splits of the Muscovite Adriss 16 mesh type, treated with 1% of vinyltriethoxysilane (the treatment typically consisted of mixing the filler with the silane and then leaving the mixture obtained to stand in contact with air for about 3 days), and (ii) 15 parts by weight of polyimide prepolymer prepared from N,N'-4,4'-diphenylmethane-bis-maleimide and 4,4'-diaminodiphenylmethane (molar ratio bisimide/diamine=2.5) and having a softening point of 70° C.

The duration of this mixing operation was about 5 minutes.

80 g of the pulverulent composite thus obtained were then introduced into a 220×120×20 mm mold (between two aluminum sheets in order to facilitate the subsequent release of the molding), the mold and its contents were then heated to a temperature of 120° C. and a pressure of 200 bars was applied for 5 minutes.

The molded shaped article was then released hot. The sintered molding obtained weighed 80 g. It comprised about 85% by weight of mica and 15% by weight of polyimide prepolymer.

(2) Production of the impregnated glass fabric:

The procedure indicated in Example 1, part (2) was followed. It should be noted that two 220×120 mm rectangular prepregs were cut out of the resultant web.

(3) Production of the copper-clad:

35 μ thick, 220×120 mm copper foils were used.

The following elements were successively stacked on the platen of a press: the first copper foil, one of the prepregs, the sintered molding, the second prepreg and the second copper foil, and the assembly was then compressed for 45 minutes at 250° C. under 200 bars. There was no flow of pure resin. The article obtained was then baked for 24 hours at 200° C.

The characteristics of the copper-clad were as follows:

dimensions: 220×120×1.6 mm; weight: 107 g; the weight of the central core corresponded to about 75% of the total weight of the copper-clad.

| flexural strength: | | | |
|---|---|---|---|
| at about 20° C.: | 22.5 kg/mm$^2$ | | |
| at 200° C.: | 17.8 kg/mm$^2$ | | |
| at 250° C.: | 14.5 kg/mm$^2$ | | |
| flexural modulus: | | | |
| at about 20° C.: | 2,285 kg/mm$^2$ | | |
| at 200° C.: | 1,905 kg/mm$^2$ | | |
| at 250° C.: | 1,660 kg/mm$^2$ | | | peel strengths:

| | Time 0 | After 141 hours at 200° C. | After 500 hours at 200° C. | After 1,000 hours at 200° C. |
|---|---|---|---|---|
| Averages in kg/cm | 1.82 | 1.93 | 1.67 | 1.93 | weight variation (in %, relative to the initial weight) during the aging at 200° C.:

after 141 hours: ΔW = −0.1%
after 1,000 hours: ΔW = −1.5% test for water uptake after 24 hours (weight variation in %, relative to the initial weight):

in steam: ΔW = +0.38%
immersion in boiling water: ΔW = +0.74% electrical characteristics:

| Properties measured | Initial values | After 24 hours in water |
|---|---|---|
| Dielectric strength in KV/mm | 23 | 13 |
| Permittivity ε at 1 MHz | 3.6 | 3.9 |
| Tangent of the loss angle at 1 MHz | 8.4 × 10$^{-3}$ | 50 × 10$^{-3}$ |
| Resistance in Ω × cm | 12 × 10$^{14}$ | 2.5 × 10$^{14}$ | coefficient of expansion: 10 × 10$^{-6}$ cm/cm/°C.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A metallized, laminated substrate consisting essentially of:

(A) an electrically insulating support element which comprises (a) a central core member comprising a major proportion by weight of a cellulosic or mica filler and a proportion of less than 40% by weight of a thermosetting resin which is a polyimide resin or a mixture of polyimide resin and epoxy resin, said central core (a) being prepared by papermaking technique, and (b) and (b') a pair of skin laminae coextensively secured to each face surface, respectively, of said central core (a), each of said skin laminae comprising a fibrous glass, asbestos or heat-stable synthetic polymer reinforcing filler, and a thermosetting resin impregnant, which thermosetting resin may either be the same as or different from the thermosetting resin comprising said central core member (a); and (B) an electrically conducting metal foil (c) coextensively adhered to the exposed face surface of one or the other of said skin laminae (b) or (b').

2. The metallized substrate as defined by claim 1, further comprising a second metal foil (c') coextensively adhered to the exposed face surface of the second of said skin laminae.

3. The metallized substrate as defined by claims 1 or 2, wherein the central core member (a) comprises 50 to 95% of the weight of the overall metallized substrate.

4. The metallized substrate as defined by claim 3, wherein said metal foil or foils are copper foils.

5. The metallized substrate as defined by claim 3, the filler which comprises said central core member (a) comprising mica splits.

6. A printed circuit comprising the metallized substrate as defined by claim 3.

7. The metallized substrate as defined by claim 3, said thermosetting resins being thermoset.

8. The metallized substrate as defined by claim 3, wherein, in the central core member (a), the proportion by weight of cellulosic or mica filler, relative to the combined weight filler + resin, ranges from 60% to 95%.

9. The metallized substrate as defined by claim 8, wherein, in the skin laminae (b) and (b'), the proportion by weight of reinforcing filler, relative to the combined weight reinforcing filler + resin, ranges from 20% to 90%.

10. The metallized substrate as defined by claim 3, wherein said resin comprising said skin laminae (b) and (b') is a phenolic, unsaturated polyester, epoxy, or polyimide resin.

11. The metallized substrate as defined by claim 10, wherein said resin comprises a thermosetting prepolymer.

12. The metallized substrate as defined by claim 11, wherein said resin comprising said central core member (a) is of the same type as that comprising said skin laminae (b) and (b'), and is a polyimide resin prepared by reacting an unsaturated dicarboxylic acid N,N'-bis-imide with a primary polyamine.

13. The metallized substrate as defined by claim 12, said polyimide resin being prepared by reacting an unsaturated dicarboxylic acid N,N'-bis-imide, a primary polyamine, and a comonomer selected from the group consisting of a mono-imide, a monomer comprising at least one $CH_2=C<$ function, an unsaturated polyester, and a hydroxylated organosilicon compound.

14. The metallized substrate as defined by claim 13, said central core member (a) comprising a cellulosic filler, and said polyimide resin being prepared by reacting an unsaturated dicarboxylic acid N,N'-bis-imide with a primary polyamine and with a hydroxylated organosilicon compound.

* * * * *